(12) United States Patent
Xiao et al.

(10) Patent No.: US 12,094,373 B2
(45) Date of Patent: Sep. 17, 2024

(54) LED CABINET, LED DISPLAY INCLUDING THE SAME AND HELPER DISASSEMBLY HANDLE

(71) Applicant: UNILUMIN GROUP CO., LTD, Shenzhen (CN)

(72) Inventors: Yulong Xiao, Shenzhen (CN); Jianlong Huang, Shenzhen (CN)

(73) Assignee: UNILUMIN GROUP CO., LTD, Shenzhen (CN)

( * ) Notice: Subject to any disclaimer, the term of this patent is extended or adjusted under 35 U.S.C. 154(b) by 183 days.

(21) Appl. No.: 17/874,713

(22) Filed: Jul. 27, 2022

(65) Prior Publication Data

US 2022/0366817 A1 Nov. 17, 2022

Related U.S. Application Data

(63) Continuation of application No. PCT/CN2020/126640, filed on Nov. 5, 2020.

(30) Foreign Application Priority Data

May 25, 2020 (CN) .......................... 202020891654.9

(51) Int. Cl.
*H05K 5/00* (2006.01)
*G09F 9/302* (2006.01)
(Continued)

(52) U.S. Cl.
CPC .............. *G09F 9/3026* (2013.01); *G09F 9/33* (2013.01); *H05K 5/0021* (2013.01); *H05K 5/023* (2013.01)

(58) Field of Classification Search
CPC ....... G09F 9/3026; G09F 9/33; H05K 5/0021; H05K 5/023
See application file for complete search history.

(56) References Cited

U.S. PATENT DOCUMENTS 8,985,832 B2 * 3/2015 Liang .................. H05K 5/0208
362/630
11,122,695 B2 * 9/2021 Yi ........................ H05K 5/0217
(Continued)

FOREIGN PATENT DOCUMENTS

CN 205406022 U 7/2016
CN 107170377 A 9/2017
(Continued)

OTHER PUBLICATIONS

International Search Report and Written Opinion issued in corresponding PCT Application No. PCT/CN2020/126640, dated Feb. 24, 2021.
(Continued)

*Primary Examiner* — Anthony Q Edwards
*Assistant Examiner* — Hung Q Dang
(74) *Attorney, Agent, or Firm* — Westbridge IP LLC

(57) ABSTRACT

Disclosed are an LED cabinet and an LED display including the LED cabinet. The LED cabinet includes a cabinet body provided with at least one mounting area for mounting LED display modules, the mounting area is provided with at least one cabinet magnetic members and a helper disassembly handle, which is movable relative to the mounting area to generate thrust to separate the LED display module from the cabinet body. The LED display includes the LED cabinet and at least one LED display module mounted on the LED cabinet, the LED display module is provided with at least one module magnetic member corresponding to at least one cabinet. When the LED display module is disassembled, the helper disassembly handle is driven to move to generate thrust to push the LED display module, so that the LED display module separate from the cabinet body of the LED cabinet.

14 Claims, 5 Drawing Sheets

(51) Int. Cl.
    *G09F 9/33*         (2006.01)
    *H05K 5/02*        (2006.01)

(56) References Cited

U.S. PATENT DOCUMENTS

| | | | | |
|---|---|---|---|---|
| 2007/0172336 A1* | 7/2007 | Hsu | ............ | F16B 5/065 |
| | | | | 411/508 |
| 2018/0359868 A1* | 12/2018 | Li | ............ | H01F 7/02 |

FOREIGN PATENT DOCUMENTS

| | | |
|---|---|---|
| CN | 207587303 U | 7/2018 |
| CN | 108766267 A | 11/2018 |
| CN | 209012968 U | 6/2019 |
| CN | 210349114 U | 4/2020 |
| JP | 2013130645 A | 7/2013 |

OTHER PUBLICATIONS

European Search Report issued in counterpart European Patent Application No. EP 20937576.5, dated Jan. 18, 2024.

* cited by examiner

B-B

LED CABINET, LED DISPLAY INCLUDING THE SAME AND HELPER DISASSEMBLY HANDLE

CROSS-REFERENCE TO RELATED APPLICATIONS

The present application is a continuation of International Application No. PCT/CN2020/126640, filed on Nov. 5, 2020, which claims priority to Chinese Patent Application No. 202020891654.9, titled "LED Cabinet and LED Display including the Same" and filed on May 25, 2020. The disclosures of the aforementioned applications are hereby incorporated by reference in their entireties.

TECHNICAL FIELD

The present application relates to the technical field of a light-emitting diode (LED) display, in particular to an LED cabinet, an LED display including the LED cabinet and a helper disassembly handle.

BACKGROUND

For more convenient installation and disassembly, currently most of the LED cabinets and the LED display modules are connected by the magnetic force. Due to large magnetic force, LED display module, when disassembled, needs a large consumption of laborious.

SUMMARY

Various embodiments of the present application provide an LED cabinet, an LED display including the LED cabinet and a helper disassembly handle.

The above technical purpose of the present application is achieved by the following technical solutions.

One aspect of the present application provides an LED cabinet including a cabinet body, wherein the cabinet body is provided with at least one mounting area for mounting an LED display module, and each mounting area is provided with at least one cabinet magnetic member and a helper disassembly handle, the helper disassembly handle is movable relative to the mounting area to generate thrust to separate the LED display module from the cabinet body.

In one embodiment, the helper disassembly handle is hinged to the mounting area and the thrust is generated to separate the LED display module from the cabinet body during a rotation of the helper disassembly handle.

In one embodiment, the helper disassembly handle comprises a rotating shaft, and each of two ends of the rotating shaft is provided with a base, and the base is sleeved on the rotating shaft and mounted in the mounting area.

In one embodiment, the helper disassembly handle includes an operating portion for driving the helper disassembly handle to rotate.

In one embodiment, the helper disassembly handle comprises an abutting part, and the mounting area is provided with a plate, the abutting part is abutted against the plate to generate the thrust during a rotation of the helper disassembly handle.

In one embodiment, the LED cabinet further includes a torsion spring, and the torsion spring is deformed during a rotation of the helper disassembly handle.

In one embodiment, the mounting area is provided with a limit plate limiting a rotation range of the helper disassembly handle during a reset.

In one embodiment, two helper disassembly handles are symmetrically provided in the mounting area.

In one embodiment, each mounting area is provided with at least four cabinet magnetic members.

In one embodiment, the operating portion is T-shaped.

In one embodiment, a part of the helper disassembly handle that needs to contact with the LED display module is provided with a protection pad.

Another aspect of the present application provides an LED display, including: an LED cabinet as mentioned above and at least one LED display module mounted on the LED cabinet, wherein each LED display module is provided with at least one module magnetic member corresponding to the at least one the cabinet magnetic member one-by-one.

Another aspect of the present application provides a helper disassembly handle for disassembling an LED display module mounted in a mounting area of an LED cabinet, wherein the helper disassembly handle is provided in the mounting area and movable relative to the mounting area to generate thrust to separate the LED display module from the LED cabinet, the helper disassembly handle including: a rotating shaft; a base provided on each end of the rotating shaft and mounted in the mounting area, wherein the base is sleeved on the rotating shaft; an operating portion for driving the helper disassembly handle to rotate; and an abutting part provided correspondingly to a plate in the mounting area, wherein when the helper disassembly handle is moved to generate the thrust, the abutting part is abutted against the plate.

In one embodiment, further including a torsion spring, wherein one end of the torsion spring is fixed to the rotating shaft and the other end of the torsion spring is fixed to the base, wherein when the helper disassembly handle is moved to generate the thrust, the torsion spring is deformed to drive the helper disassembly handle to reset.

In one embodiment, the operating portion is T-shaped, and a part of the helper disassembly handle that needs to contact with the LED display module is provided with a protection pad.

Details of one or more embodiments of the present application are presented in the drawings and description below, and the other features and advantages will become apparent from the specification, the drawings, and the claims.

BRIEF DESCRIPTION OF THE DRAWINGS

In order to more clearly illustrate the technical solutions in the embodiments of the present application, the drawings used in the embodiments will be introduced briefly below. It is obvious that the drawings described below are only some of the embodiments of the present application. Other embodiments can be obtained by those skilled in the art based on these drawings without creative work.

DETAILED DESCRIPTION OF THE EMBODIMENTS

In order to make the technical problems to be solved, technical solutions and beneficial effects of the present application clearer and more understandable, the present application will be described in detail in combination with the drawings and embodiments as below. It should be understood that the specific embodiments described herein are used only to explain, but not limit, the present application.

Figure 1:
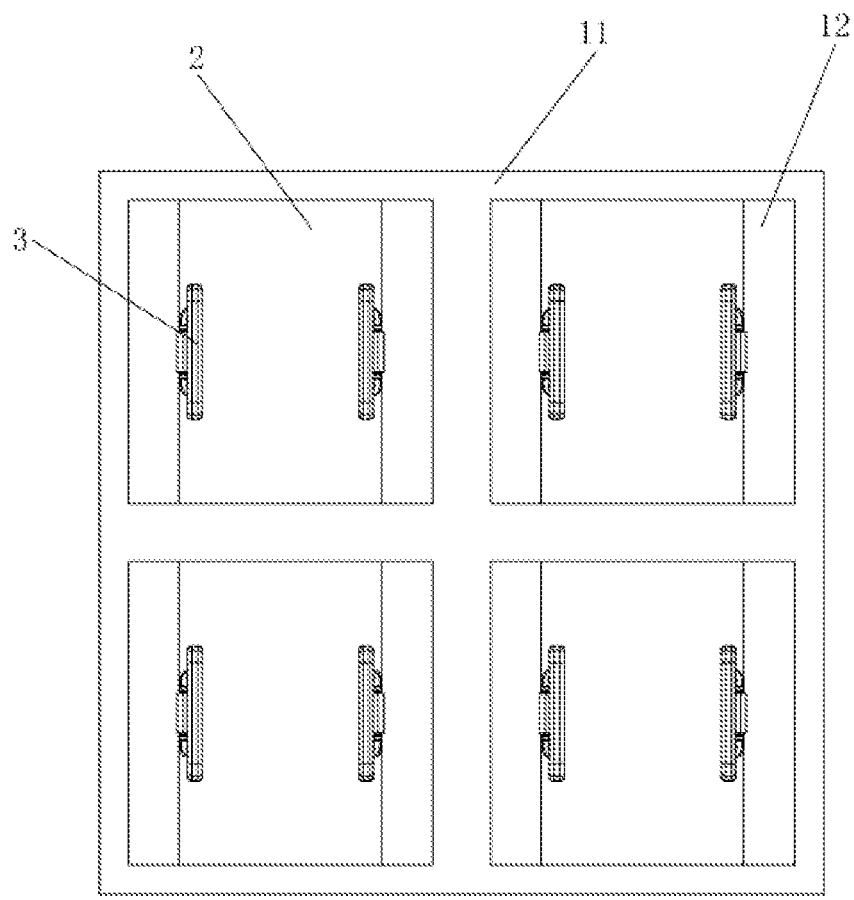
FIG. 1 is a schematic structural view of the LED display in an embodiment.
Figure 2:
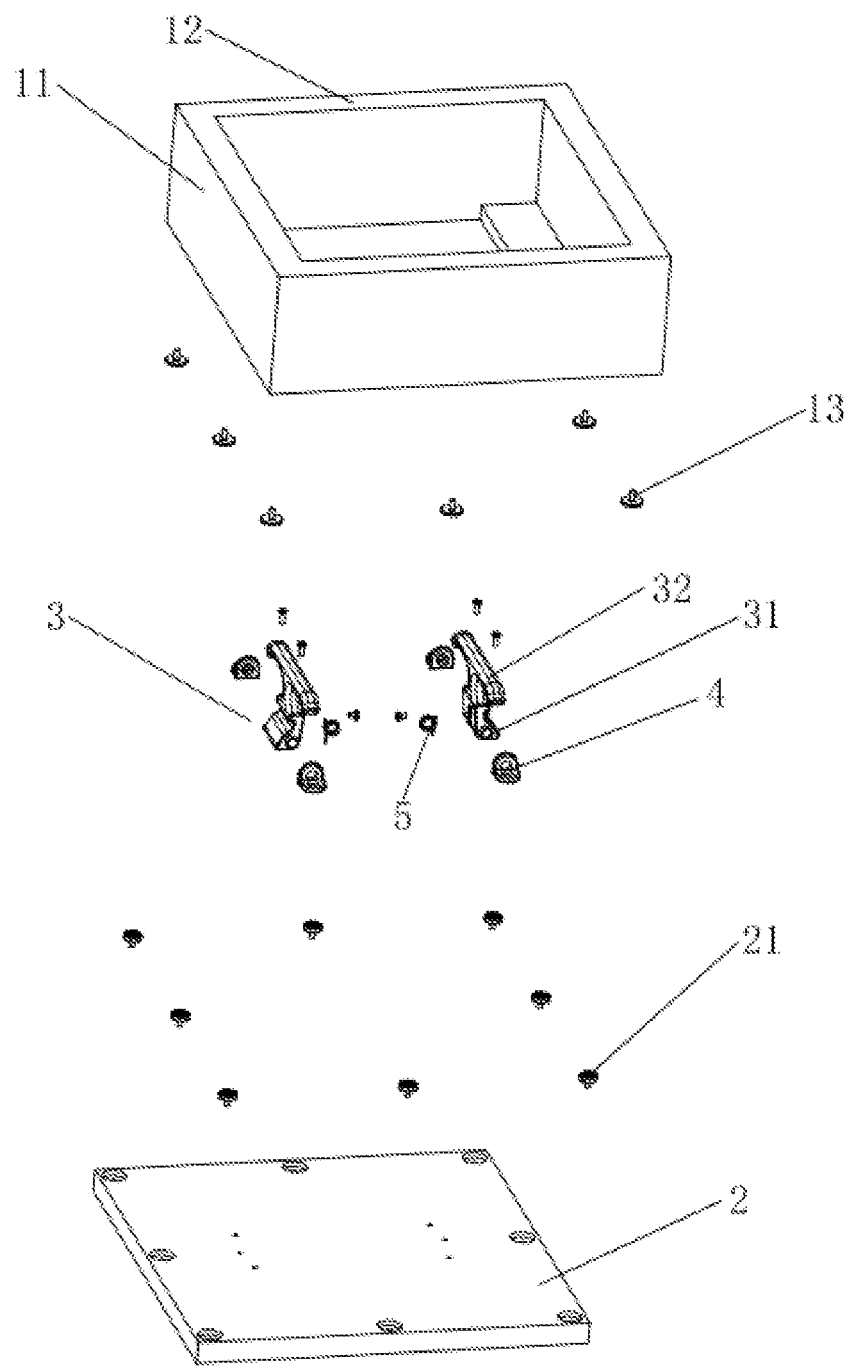
FIG. 2 is an exploded view of a single mounting area of an LED cabinet and a single LED display module in the embodiment.
Figure 4:
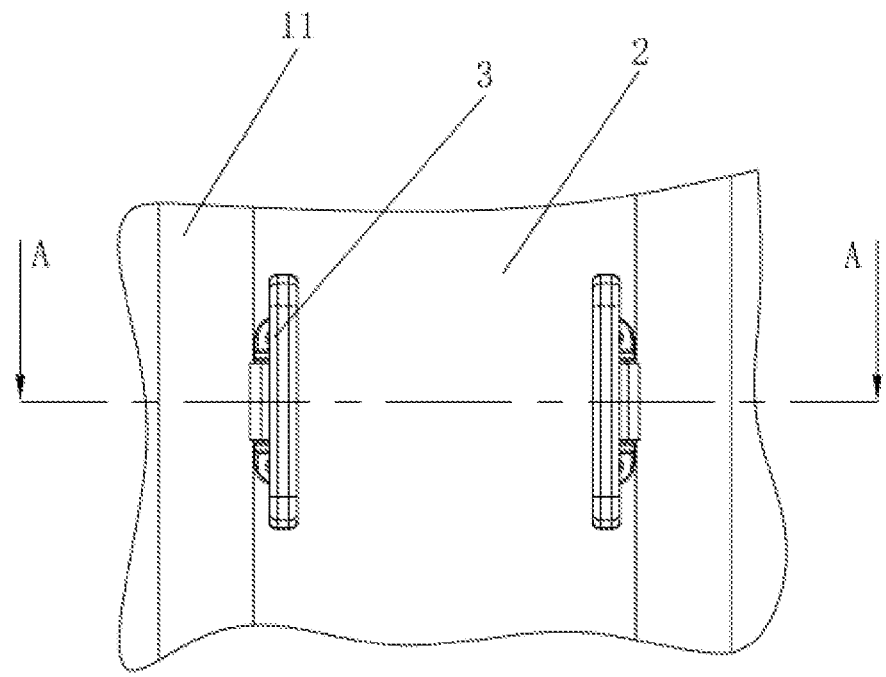
FIG. 4 is a partial view of the LED display after the LED display module is mounted with the LED cabinet in the embodiment.
Figure 5:
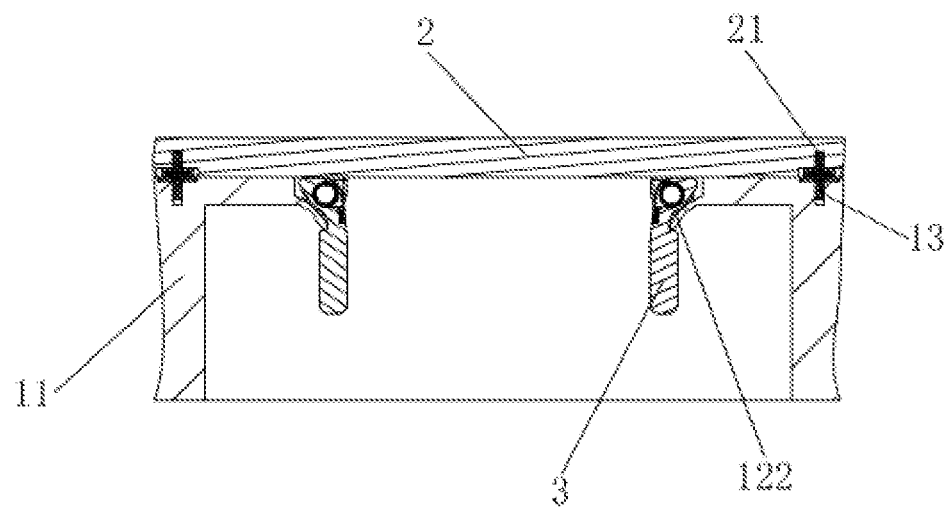
FIG. 5 is a sectional view along line A-A of FIG. 4.
Figure 6:
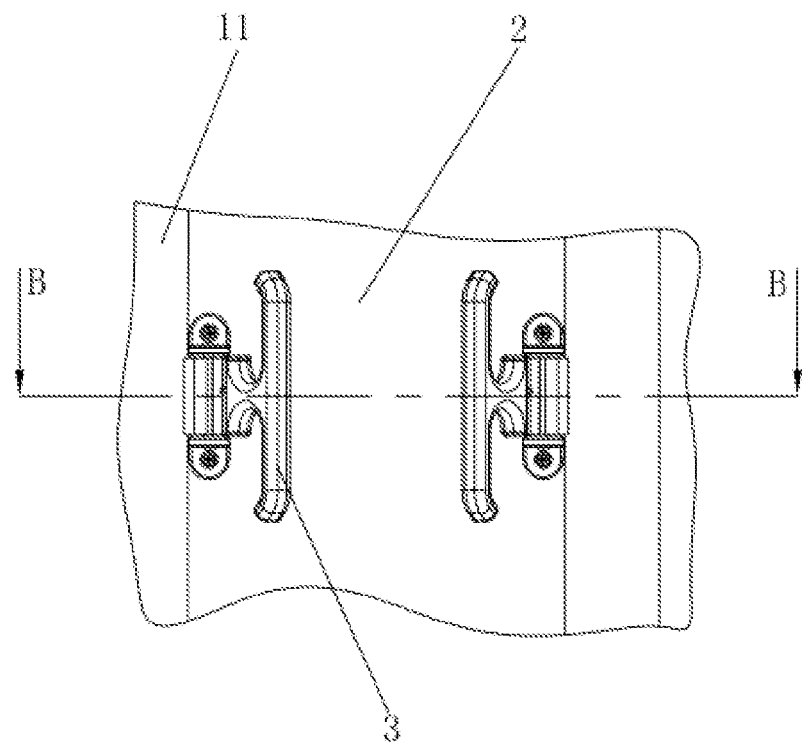
FIG. 6 is a partial view of the LED display after the LED display module is separated from the LED cabinet in the embodiment.
Figure 7:
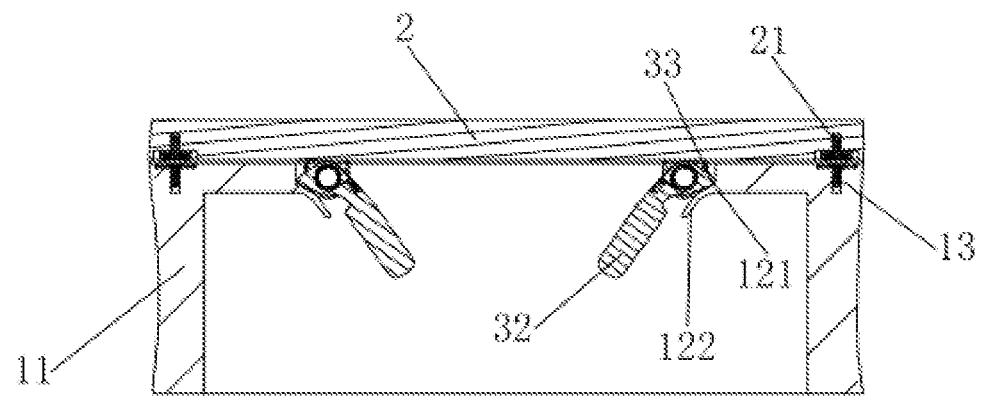
FIG. 7 is a sectional view along line B-B of FIG. 6.

The embodiment discloses an LED display, as shown in FIG. 1, the LED display includes an LED cabinet and at least one LED display module 2 mounted on the LED cabinet. As shown in FIG. 1, in this embodiment, four LED display modules 2 are included. The LED cabinet includes a cabinet body 11 provided with four mounting areas 12. The four LED display modules 2 are mounted on the four mounting areas 12 correspondingly. As shown in FIG. 2, each mounting area 12 is provided with at least one cabinet magnetic member 13, and each LED display module 2 is provided with a module magnetic member 21 corresponding to the cabinet magnetic member 13. The cabinet magnetic member 13 and the module magnetic member 21 are adsorbed together. In this embodiment, as shown in FIG. 2, each mounting area 12 is provided with eight cabinet magnetic members 13, and each LED display module 2 is also provided with eight module magnetic members 21. Each mounting area 12 is provided with a helper disassembly handle 3. The helper disassembly handle 3 is movable relative to the mounting area 12 to generate thrust to separate the LED display module 2 from the cabinet body 11 of the LED cabinet. In this embodiment, as shown in FIG. 2, each mounting area 12 is provided with two helper disassembly handles 3 and the two helper disassembly handles 3 are symmetrically arranged. As shown in FIGS. 4 and 5, the LED display module 2 is mounted in the mounting area 12 of the LED cabinet, and the LED display module 2 and the LED cabinet are firmly connected by the adsorption force of the cabinet magnetic member 13 and the module magnetic member 21. As shown in FIGS. 6 and 7, when to disassemble the LED display module 2, the helper disassembly handle 3 is driven to move and generate thrust. The thrust pushes the LED display module 2 to separate from the LED cabinet body 11. Compared to the existing disassembly by manpower, the disassembly is labor-saving and more convenient.

Figure 3:
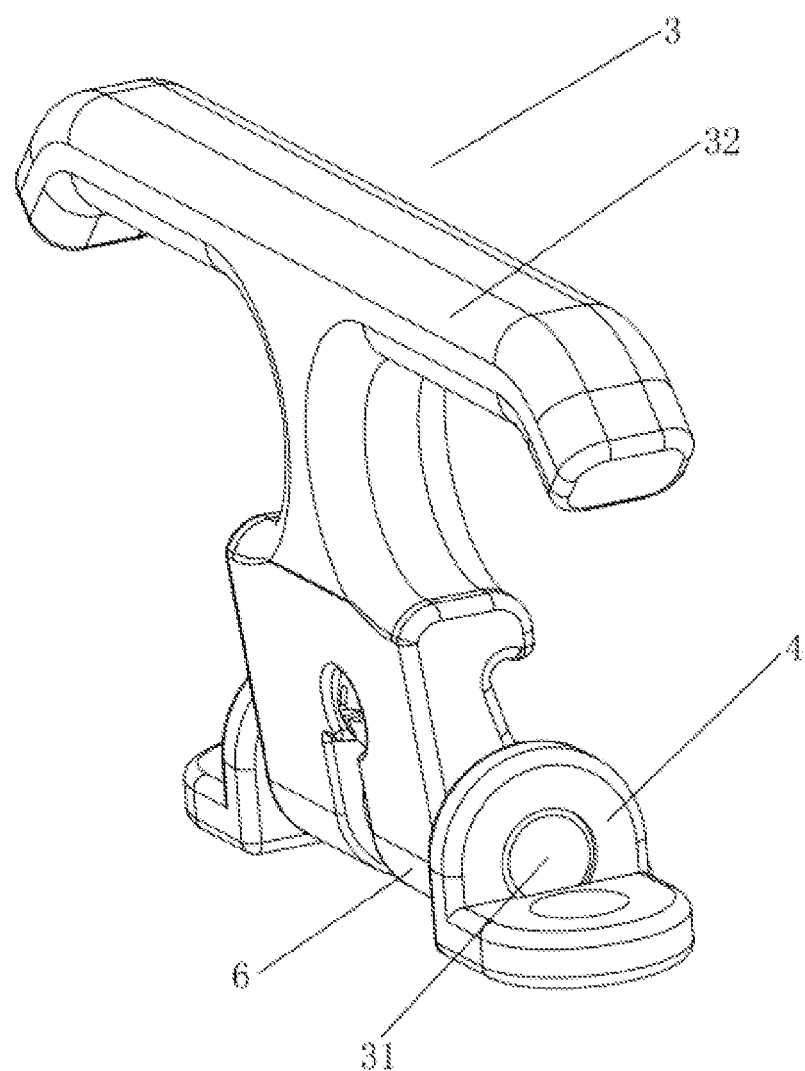
FIG. 3 is an enlarged view of a helper disassembly handle in the embodiment.

In this embodiment, as shown in FIGS. 2 and 3, the helper disassembly handle 3 is hinged to the mounting area 12 and generates the thrust to separate the LED display module 2 from the cabinet body 11 of the LED cabinet when rotating. In one embodiment, the helper disassembly handle 3 includes a rotating shaft 31, each of two ends of the rotating shaft 31 is provided with a base 4. The base is sleeved on the rotating shaft 31 and mounted fixedly in the mounting area 12. The helper disassembly handle 3 also includes an operating portion 32 for driving the helper disassembly handle 3 to rotate. In one embodiment, the operating portion 32 is T-shaped for easy grip. As shown in FIGS. 6 and 7, the helper disassembly handle 3 also includes an abutting part 33, and the mounting area 12 is provided with a plate 121. When the helper disassembly handle 3 rotates to generate the thrust, the abutting part 33 abuts against the plate 121 and is subject to the reaction force applied by plate 121 to more easily generate the thrust. As shown in FIG. 2, in this embodiment, the rotating shaft 31 of the helper disassembly handle 3 is sleeved with a torsion spring 5, one end of the torsion spring 5 is fixed to the rotating shaft 31, and the other end of the torsion spring 5 is fixed to the base 4. When the handle 3 rotates to generate thrust, the torsion spring 5 deforms to generate an elastic force to drive the handle 3 to reset. As shown in FIG. 4 and FIG. 5, in this embodiment, the mounting area 12 is provided with a limit plate 122 for limiting a rotation range of the helper disassembly handle 3 during the reset, which avoids the impact on the LED display module 2 due to inertia during the reset, and also avoids damage to the LED display module 2 due to misoperation during the reset after the helper disassembly handle 3 is rotated. As shown in FIG. 3, in this embodiment, a part of the helper disassembly handle 3 that needs to contact with the LED display module 2 is provided with a protection pad 6 to reduce the instantaneous impact on the LED display module 2, and avoid the damage to the LED display module 2.

As shown in FIGS. 4 and 5, after the LED display module 2 is mounted in the mounting area 12 of the cabinet body 11 of the LED cabinet, the LED display module 2 is firmly connected to the cabinet body 11 by the adsorption force between the cabinet magnetic member 13 and the module magnetic member 21, at this time, the helper disassembly handle 3 does not contact with the LED display module 2. As shown in FIGS. 6 and 7, when the LED display module 2 needs to be disassembled, the helper disassembly handle 3 is rotated by the operating portion 32 till the abutting part 33 is abutted against the plate 121 to generate thrust, so that the LED display module 2 is separated from the LED cabinet, and torsion spring 5 deforms. After the external force is removed from the helper disassembly handle 3, the elastic force produced due to the elastic deformation of the torsion spring 5 drives the handle 3 to reset.

The above specific embodiment is only used to explain, and not to limit, the present application, modifications, without creative contribution, to the above embodiment can be made by those skilled in the art as needed after reading this specification, and it will be protected by claimed scope of the present application if the modifications are within the claimed scope of the present application.

The invention claimed is:

1. A light-emitting diode (LED) cabinet comprising a cabinet body, wherein the cabinet body is provided with at least one mounting area for mounting an LED display module, and each mounting area is provided with at least one cabinet magnetic member and a helper disassembly handle, the helper disassembly handle is movable relative to the mounting area to generate thrust to separate the LED display module from the cabinet body; the helper disassembly handle is hinged to the mounting area and the thrust is generated to separate the LED display module from the cabinet body during a rotation of the helper disassembly handle; the mounting area is provided with a limit plate for limiting a rotation range of the helper disassembly handle during reset.

2. The LED cabinet according to claim 1, wherein the helper disassembly handle comprises a rotating shaft, and each of two ends of the rotating shaft is provided with a base, and the base is sleeved on the rotating shaft and mounted in the mounting area.

3. The LED cabinet according to claim 1, wherein the helper disassembly handle comprises an operating portion for driving the helper disassembly handle to rotate.

4. The LED cabinet according to claim 3, wherein the operating portion is T-shaped.

5. The LED cabinet according to claim 1, wherein the helper disassembly handle comprises an abutting part, and the mounting area is provided with a plate, the abutting part is abutted against the plate to generate the thrust during a rotation of the helper disassembly handle.

6. The LED cabinet according to claim 1, further comprising a torsion spring, wherein the torsion spring is deformed during a rotation of the helper disassembly handle.

7. The LED cabinet according to claim 6, wherein the mounting area is provided with a limit plate limiting a rotation range of the helper disassembly handle during a reset.

8. The LED cabinet according to claim 1, wherein two helper disassembly handles are symmetrically provided in the mounting area.

9. The LED cabinet according to claim 1, wherein each mounting area is provided with at least four cabinet magnetic members.

10. The LED cabinet according to claim 1, wherein a part of the helper disassembly handle that needs to contact with the LED display module is provided with a protection pad.

11. An LED display comprising:
the LED cabinet according to claim 1; and
at least one LED display module mounted on the LED cabinet, wherein each LED display module is provided with at least one module magnetic member corresponding to the at least one the cabinet magnetic member one-by-one.

12. A helper disassembly handle for disassembling an LED display module mounted in a mounting area of the LED cabinet according to claim 1, wherein the helper disassembly handle is provided in the mounting area and movable relative to the mounting area to generate thrust to separate the LED display module from the LED cabinet,
wherein the helper disassembly handle comprises:
a rotating shaft;
a base provided on each end of the rotating shaft and mounted in the mounting area, wherein the base is sleeved on the rotating shaft;
an operating portion for driving the helper disassembly handle to rotate; and
an abutting part provided correspondingly to a plate in the mounting area, wherein when the helper disassembly handle is moved to generate the thrust, the abutting part is abutted against the plate.

13. The helper disassembly handle according to claim 12, further comprising a torsion spring, wherein one end of the torsion spring is fixed to the rotating shaft and the other end of the torsion spring is fixed to the base, wherein when the helper disassembly handle is moved to generate the thrust, the torsion spring is deformed to drive the helper disassembly handle to reset.

14. The helper disassembly handle according to claim 12, wherein the operating portion is T-shaped, and a part of the helper disassembly handle that needs to contact with the LED display module is provided with a protection pad.

\* \* \* \* \*